(12) United States Patent
Bohnert

(10) Patent No.: US 7,075,286 B2
(45) Date of Patent: *Jul. 11, 2006

(54) FIBER-OPTIC CURRENT SENSOR

(75) Inventor: Klaus Bohnert, Oberrohrdorf (CH)

(73) Assignee: ABB Research LTD, Zurich (CH)

( * ) Notice: Subject to any disclaimer, the term of this patent is extended or adjusted under 35 U.S.C. 154(b) by 0 days.

This patent is subject to a terminal disclaimer.

(21) Appl. No.: 10/332,504

(22) PCT Filed: Jul. 4, 2001

(86) PCT No.: PCT/CH01/00415

§ 371 (c)(1), (2), (4) Date: Jan. 10, 2003

(87) PCT Pub. No.: WO02/04963

PCT Pub. Date: Jan. 17, 2002

(65) Prior Publication Data

US 2004/0101228 A1 May 27, 2004

(30) Foreign Application Priority Data

Jul. 10, 2000 (EP) ................................ 08106056

(51) Int. Cl.
*G01R 15/24* (2006.01)
*G01B 9/02* (2006.01)
*G02B 6/26* (2006.01)

(52) U.S. Cl. ............ 324/96; 324/244.1; 356/477; 356/483; 250/227.19; 385/12; 385/14

(58) Field of Classification Search ................ 385/12; 356/483; 324/96
See application file for complete search history.

(56) References Cited

U.S. PATENT DOCUMENTS 5,956,171 A * 9/1999 Dennis et al. .............. 359/281
5,987,195 A * 11/1999 Blake ......................... 385/12

(Continued)

FOREIGN PATENT DOCUMENTS

CH            671 638 A5      9/1986

(Continued)

OTHER PUBLICATIONS

Guido Frosio and René Dändliker, "Reciprocal Reflection Interferometer for a Fiber-Optic Faraday Current Sensor", Applied Optics, vol. 33, No. 25, Sep. 1, 1994, pp. 6111-6122.

*Primary Examiner*—Vinh Nguyen
*Assistant Examiner*—Emily Y Chan
(74) *Attorney, Agent, or Firm*—Buchanan Ingersoll PC

(57) ABSTRACT

An optical current sensor having a reflection interferometer (1, 10) has, in its fiber-optic lead (2), a polarization-maintaining first fiber branch (20) for two forward-traveling orthogonally polarized waves and a polarization-maintaining second fiber branch (20') for two backward-traveling orthogonally polarized waves. In this case, the two fiber branches (20, 20') are connected to one another via a coupler (8) on the sensor side. The first fiber branch (20) is connected to a light source (4) and the second fiber branch (20') is connected to the detector (5). A means for phase shifting (7) is funcionally connected to at least one of the fiber branches (20, 20'). It is thus possible to achieve a quasi-static control of the phase shift of the waves, so that less stringent requirements can be made of the means for phase shifting than of the phase modulators that are usually used in current sensors of this type.

15 Claims, 3 Drawing Sheets

U.S. PATENT DOCUMENTS

| | | | |
|---|---|---|---|
| 6,057,678 A * | 5/2000 | Tagiri et al. | 324/96 |
| 6,281,672 B1 * | 8/2001 | Terai et al. | 324/96 |
| 6,307,632 B1 * | 10/2001 | Blake | 356/477 |
| 6,636,321 B1 * | 10/2003 | Bohnert | 356/483 |

FOREIGN PATENT DOCUMENTS

| | | |
|---|---|---|
| EP | 0 569 700 A2 | 11/1993 |
| WO | WO 99/17129 | 4/1999 |

* cited by examiner

FIBER-OPTIC CURRENT SENSOR

CROSS-REFERENCE TO RELATED APPLICATIONS

This application is a national stage application under 35 U.S.C. §371 of PCT/CH01/00415, filed on Jul. 4, 2001. The entire disclosure of which is incorporated herein by reference.

BACKGROUND OF THE INVENTION

1. Field of the Invention

The invention relates to a fiber-optic current sensor having a reflection interferometer, a method for setting an operating point in a current sensor of this type, and a method for current measurement by means of a current sensor of this type.

2. Background Information

A fiber-optic current sensor of the generic type is disclosed by DE-A-4,224,190 and G. Frosio et al., "Reciprocal reflection interferometer for a fiber-optic Faraday current sensor", Applied Optics, Vol. 33, No. 25, pages 6111–6122 (1994). The current sensor has a magneto-optically active sensor fiber which is wound in coil form and encloses a current conductor. The sensor fiber is mirror-coated at one end and, at the other end, it is connected via a phase delay element to a polarization-maintaining optical lead fiber via which light can be coupled into and out of the sensor fiber. In this case, the lead fiber propagates mutually orthogonally linearly polarized optical waves. With the aid of a fiber-optic phase retarder, said waves are converted into two circularly polarized waves before entering the sensor coil, the two circularly polarized waves having a mutually opposite rotation sense. After traversing the sensor coil, the two circular waves are reflected at the end of the coil, and they travel back through the coil with an interchanged polarization sense.

If a current then flows through the current conductor, the magnetic field of the current brings about a differential phase shift between the two circular optical waves. This effect is called the magneto-optical or Faraday effect. As a result of traversing the coil twice, the waves accumulate a differential phase shift of $\Delta\Phi_s = 4\,V\,N\,I$, where V denotes the Verdet's constant of the fiber, N denotes the number of fiber turns in the coil and I denotes the current through the current conductor.

Upon emerging from the coil, the circular waves are converted into orthogonal linearly polarized waves again in the phase retarder and are passed via the lead fiber to a detection system. The polarization directions of the returning orthogonal waves are interchanged compared to the forward-traveling waves. The phase shift caused by the current can be detected by the two reflected linearly polarized waves being brought to interference in a polarizer adjoining the lead fiber.

In order to achieve a useable interference signal, the effective operating point of the interferometer must be brought to a linear region of a cos-shaped interference function. This is done by means of a modulation unit with a phase modulator which alters the birefringence in the lead fiber and thus a differential phase of the two waves. Since both forward-traveling and backward-traveling waves pass through the same phase modulator, the latter has to oscillate with a frequency adapted to the circulation time of the waves, in order to modulate the differential phase of the two interfering waves non-reciprocally. Without a modulation unit, the phase difference between the two interfering waves would be equal to zero.

The modulation frequency ideally corresponds to the inverse value of twice the circulation time of the light in the interferometer. The frequency of the modulation typically lies in the range between 100 kHz and a few MHz and is determined inter alia by the length of the fiber connection to the sensor fiber, that is to say the lead fiber.

The current-induced phase shift can be determined by suitable demodulation. The demodulation techniques are the same ones which are used for fiber-optic gyroscopes and are described for example in R. A. Bergh et al. "An Overview of fiber-optic gyroscopes", J. Lightwave Technol. 2, 91'107 (1984). In this case, a distinction is made essentially between open-loop and closed-loop configurations.

In order that the fiber-optic current sensor can be employed in practice, it requires a good long-term stability. Unfortunately, simple modulation units, for example those with piezoelectric modulators, have a drift in their amplitude, e.g. as a result of temperature changes. Therefore, in the prior art, use is made of relatively expensive modulation units which are as stable as possible and have integrated optical modulators or means for compensating fluctuations in amplitude. Such means are, for example, measuring means for determining the amplitude of the phase modulation in order to keep it constant by means of an additional regulating circuit. However, said means lead to a complicated construction of the sensor and thus increase the costs.

SUMMARY

It is an object of the invention to provide a fiber-optic current sensor in a reflection configuration which has a good long-term stability, without imposing excessively stringent requirements on the modulation unit, in particular on the electronic evaluation unit thereof.

In a current sensor according to an exemplary embodiment of the invention, forward-traveling and backward-traveling waves propagate in two separate fiber segments over part of their path, a means for phase shifting being functionally connected to at least one of said fiber segments. The known phase modulators are suitable as means of this type. By virtue of the two segments, a wave that has traveled out and returned has been influenced only once by the same modulator. It is thus possible, by means of a quasi-statically operated modulator, to shift the operating point to the quadrature point and to additionally to compensate for non-current-induced fluctuations—caused by changes in temperature, for example—in the phase difference between two synchronous waves. A modulator with a small frequency band, for example of approximately 5 Hz, is sufficient for this.

The current sensor according to the invention furthermore has the advantage that the length of the polarization-maintaining fiber no longer has to be adapted to the modulation frequency, but rather can be chosen arbitrarily. There is practically no longer a lower limit for the length of the lead fiber, as a result of which costs can in turn be saved.

In one exemplary variant of the method according to the invention, not only are temperature-induced phase shifts and phase shifts induced by other influences compensated for quasi-statically, but also a dynamic modulation is used which is effected with a frequency corresponding to the AC current to be measured. This can be carried out by the same modulator or by a second modulator. In the second case, the second modulator is preferably arranged in the other fiber branch.

BRIEF DESCRIPTION OF THE DRAWINGS

The subject matter of the invention is explained in more detail below using preferred exemplary embodiments which are illustrated in the accompanying drawings, in which.

DETAILED DESCRIPTION OF THE EXEMPLARY EMBODIMENTS

Figure 1:
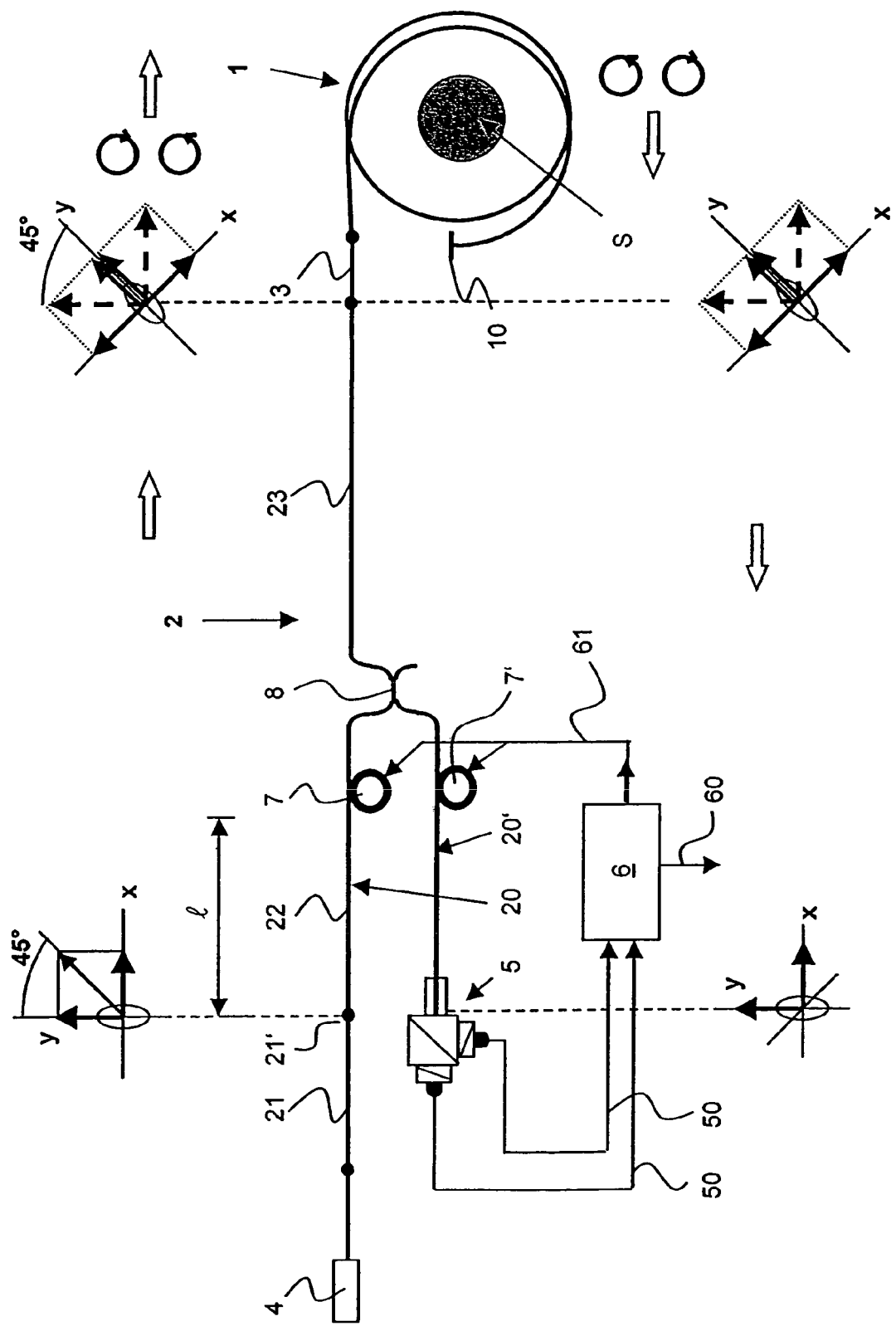
FIG. 1 shows a fiber-optic current sensor according to the invention.

FIG. 1 shows a fiber-optic current sensor according to the invention, having a reflection interferometer. A sensor fiber 1 is wound in coil form around a current conductor L. It preferably has a round core cross section and is preferably produced from quartz glass. A first end of the sensor fiber 1 is connected to a fiber-optic lead 2. A second end is provided with a reflector 10. The reflector 10 is generally formed by a mirror-coating of the second fiber end. The lead 2 is designed, at least in sections, to be birefringent and therefore, polarization-maintaining. It preferably has an elliptical core cross-section for generating the birefringence. The use of a stress-induced birefringent fiber is possible, however. The lead 2 is connected to the sensor fiber 1 via a phase delay element 3, a λ/4 phase delay fiber segment preferably being used for this.

Furthermore, there is a light source 4 present, the light from which is communicated through the fibers. A suitable light source is, in particular, one with a small coherence length, in particular a superluminescence diode, a laser diode operated below the laser threshold, an LED or a broadband fiber light source. The sensor has a detector 5, which detects light that has been transmitted through the sensor fiber and been brought to interference. Said detector 5 is connected via detector signal lines 50 to a signal processor 6, which communicates the sensor signal to an electronic evaluation unit (not illustrated) via a sensor signal line 60.

According to the invention, the lead 2 has two polarization-maintaining fiber branches 20, 20'. Suitable fiber branches 20, 20' are, in particular, fiber segments having an elliptical core. The fiber branches 20, 20' have at least approximately the same optical length, that is to say they are identical within the coherence length of the light source 4. The optical path differences which two modes or waves propagating in different fiber branches accumulate are thus identical. The two fiber branches are connected in parallel and are connected to one another in the region of their sensor-side ends via a polarization-maintaining coupler 8. In the preferred exemplary embodiment illustrated here, the coupler 8 is a fiber coupler having an elliptical core, its axes being arranged in such a way that they are parallel to the axes of the fiber branches 20, 20'. However, it is also possible to use other types of couplers. The two fiber branches 20, 20' are preferably connected to the coupler in such a way that the directions of the linear polariztions of the forward-traveling (branch 20) and the returning (branch 20') waves are mutually interchanged relative to the fiber axis. An optical wave which oscillates in the first branch 20 parallel to the long core axis thus oscillates in the second branch 20' parallel to the short axis, and vice versa.

The first fiber branch, the lead branch 20, is functionally connected to the light source 4 at its other end. The second fiber branch, the detection branch 20', is functionally connected to the detector 5.

The lead branch 20 is connected to a polarizer 21 in the transition to the light source 4. The polarizer 21 is preferably directed in such a way that its polarization directions lie at 45° to the principal axes of the fiber branch 20. In this example, a fiber polarizer 21 is used which is connected to the lead branch 20 via a 45° splice 21'. The use of other polarizers is possible, however.

The fiber branch 20 furthermore preferably has a decoherence element 22 of length 1. This decoherence element 22 generates a differential optical path difference in the forward-traveling waves propagating in the lead branch 20, which path difference is longer than the coherence length of the light source 4. This prevents disturbing effects caused by mode coupling in the means for phase shifting 7, 7' (phase modulator 7, 7') described below. If a modulator 7' is located in the branch 20', it is preferably arranged at at least a distance length 1 upstream of the fiber end or the detector 5.

At least one of the two fiber branches 20, 20' is functionally connected to a phase shifting unit. The phase shifting unit actually corresponds to the known phase modulation unit and essentially comprises the above-described signal processor 6 and also at least one phase modulator 7, 7' connected thereto via a modulation signal line 61. However, in this case the at least one phase modulator 7, 7' is not used in the known manner for modulation of the phase difference, but rather serves as a means for quasi-steady-state phase shifting. A piezoelectric modulator is preferably used as the phase modulator 7', part of the respective fiber branch 20, 20' being wound around a piezoelectric body of the modulator 7'. However, it is also possible to use other modulators, in particular an integrated optical modulator based on the electro-optical effect in a waveguide.

In a very simple embodiment, only one of the two fiber branches 20, 20' is functionally connected to a phase modulator 7', the selection of the fiber branch being arbitrary. In the exemplary embodiment illustrated here, however, each fiber branch 20, 20' is functionally connected to a phase modulator 7, 7'. The two phase modulators 7, 7' are preferably connected to the same signal processor.

In FIG. 1, the polarizations of waves traveling forward and backward in the current sensor according to the invention are represented by narrow arrows. Moreover, wide arrows indicate the direction of propagation of the waves. A forward-traveling optical wave emitted by the light source 4 is linearly polarized in the polarizer 21 and is coupled into the polarization-maintaining lead fiber 2, here into the lead branch 20, via the 45° splice as two waves having mutually orthogonal polarizations. The two polarizations are also referred to as two orthogonal linearly polarized waves hereinafter. The decoherence element 22 of the lead fiber 2 has a coherence-damaging effect on the waves and generates, in the two propagating orthogonally polarized waves, a differential optical path difference which is significantly longer than the coherence length of the light source 4. The length 1 of the decoherence element 22 must be chosen accordingly, where $\Delta L = 1 \Delta n_G$ should be satisfied, with $\Delta L$ the path difference and $\Delta n_G$ the the group index difference seen by the two polarizations.

The orthogonal polarizations of the forward-traveling wave traverse the region of influence of the first modulator 7 and pass through the coupler 8 and via a further polarization-maintaining fiber segment 23 of the lead 2 to the phase delay element 3, preferably a the λ/4 phase delay fiber segment, where the orthogonally polarized waves are converted into two left and right circularly polarized waves, as is illustrated in FIG. 1. The circular waves traverse the sensor fiber 1, are reflected at the coil end 10, interchange their polarization states in the process, travel back through the coil and are converted into orthogonally linearly polarized waves again in the λ/4 retarder 3, the polarization of which waves is now perpendicular to the polarization of the corresponding waves of the forward direction. For the case where the branches 20, 20' have at least approximately the same optical length, the total differential phase difference between the forward-traveling and returning waves is thus equal to zero at the detector-side fiber end in the case where no current flows through the current conductor S, and not equal to zero if a current flows. The returning waves are conducted via the coupler 8 and the detector branch 20' and brought to interference in the detector 5 and interference signals produced as a result are detected.

Figure 2:
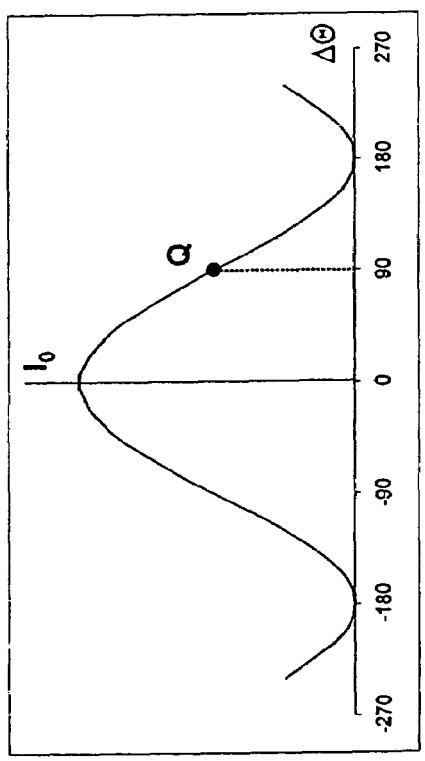
FIG. 2 shows a graphical representation of an operating point setting in a quasi-static phase control.

According to the invention, the differential phase of the orthogonal polarizations is controlled by means of a quasi-steady-state phase control and a suitable operating point is thus set. Such a quasi-steady-state phase control is disclosed by D. A. Jackson et al., "Elimination of drift in a single-mode optical fiber interferometer using a piezoelectrically stretched coiled fiber", Applied Optics, vol. 19, No. 17, 1980, where it is used in the case of a fiber-optic Mach-Zehnder interferometer. In this case, the operating point is chosen at the quadrature point Q, that is to say that $\Delta\Theta=\Delta\Theta_1+\Delta\Theta_2$ is chosen to be equal to $\pi/2+m\pi$, where m is an integer. The setting of the operating point as is illustrated in FIG. 2. In this case, $\Delta\Theta$ is the combined phase difference which the waves that have propagated through the current sensor have accumulated in the two separate fiber branches. In this case, $\Delta\Theta_1$ and $\Delta\Theta_2$ are the phase differences in the two branches. In the case where the two fiber branches have the same optical length, $\Delta\Theta_1$ is equal to $-\Delta\Theta_2$ in the currentless state and on account of the reversed polarization.

In the sensor according to the invention, it is possible to control phases of the orthogonal polarizations of the forward-traveling and/or of the backward-traveling waves.

The setting of the operating point, the control of the phase difference and the signal detection are effected, according to the invention, by the splitting of the forward-traveling and backward-traveling waves between the two separate fiber branches 20, 20'.

Figure 3:
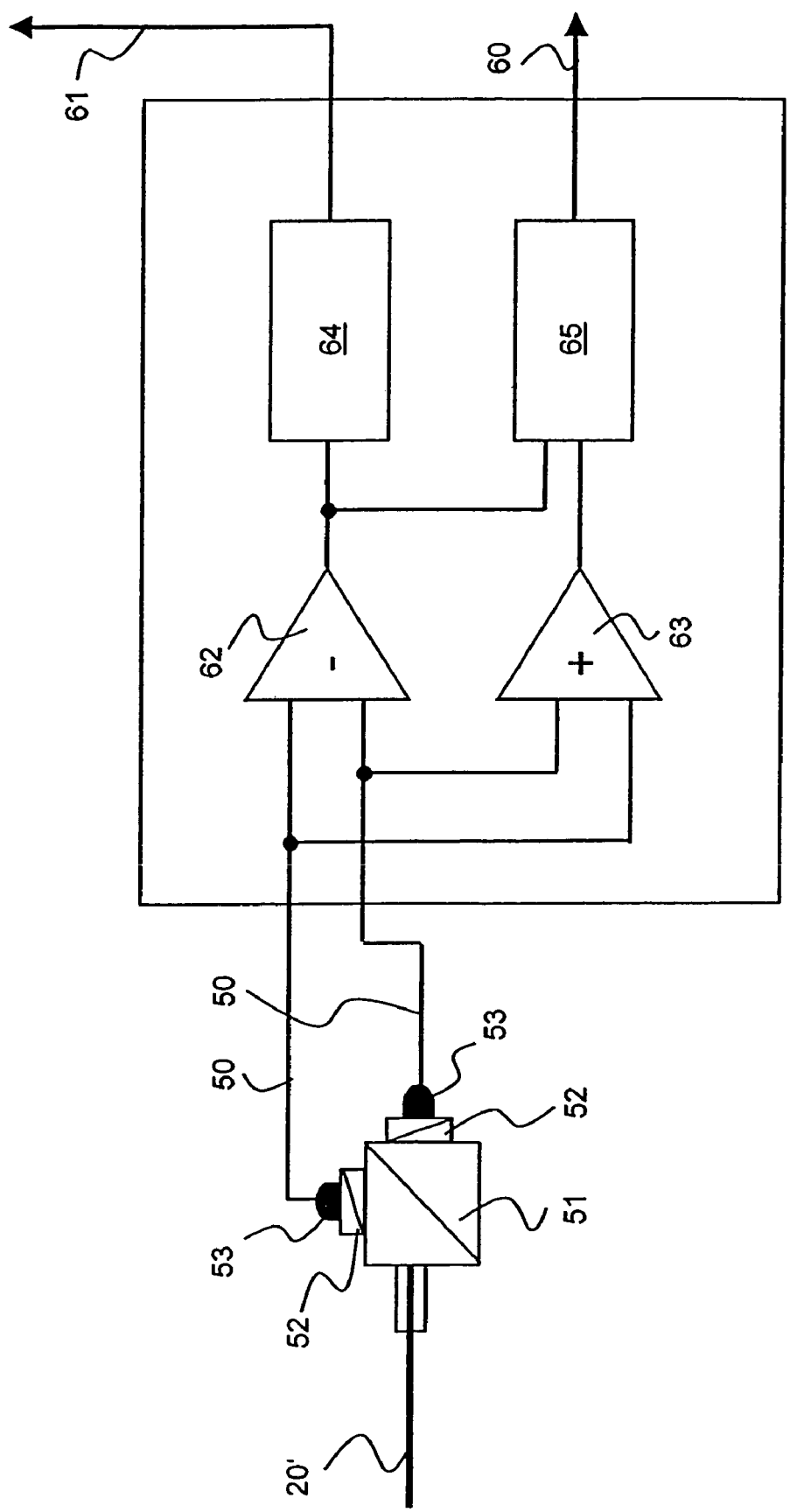
FIG. 3 shows a detector and a modulation unit of the current sensor according to the invention in accordance with a first embodiment of the invention.

The detector 5 used for this and the modulation unit are described in more detail below with reference to FIG. 3. The returning orthogonal linearly polarized waves pass through the detection branch 20' into the detector 5. The latter has a preferably polarization-insensitive beam splitter 51, which splits the light preferably in the ratio 1:1. Each of the two resulting pairs of orthogonal waves is brought to interference in a polarizer 52 acting as an analyzer, and the resulting light $I_+$ and $I_-$ is detected in a respective photodiode 53. The analyzers 52 are oriented at an angle of ±45° relative to the fiber axes of the detection branch 20', to be precise such that their own transmission directions are perpendicular to one another. The following holds true for the detected photodiode signals $I_+$ and $I_-$ $$I_\pm=I_0(1\pm K\cos(\Delta\Phi+\Delta\Theta))$$

where $I_0$ is the light intensity at the quadrature point and K is the visibility of the interference fringes and where $\Delta\Theta$=the combined phase difference and $\Delta\Phi$=the differential phase shift.

In a subtraction element 62 of the signal processor 6, the difference between these two photodiode signals is formed and fed to a quadrature control 64. This quadrature control 64 regulates the phase modulator or modulators in such a way that the difference in the currentless state and with no external influences is equal to zero. The quadrature point Q is reached in this case. This regulation is effected quasi-statically, that is to say the system always effects regulation to the quadrature point, the voltage value being adapted in the event of any drift in the operating point or in the event of slow phase shifts induced by external influences. A quadrature control 64 with a small frequency bandwidth, for example of 5 Hz, suffices for this.

In a preferred variant of the method, however, the alternating phase modulation brought about by an AC current that is to be measured in the current conductor S is additionally compensated for as well. This requires a quadrature control with a larger bandwidth, for example of 100 Hz, which also compensates the periodic fluctuations in the difference. This compensation is a dynamic, closed-loop control. In this case, the voltage generated by the quadrature control and present at the modulators 7, 7' simultaneously serves as output signal of the sensor.

It is possible for a single modulator to be used for both the quasi-static and the dynamic control. In a preferred embodiment, however, there are two modulators 7, 7' present, one being used for the quasi-static control and the other for the dynamic control.

If the current-induced phase modulation is not compensated, the signal processor furthermore has an addition element 63 and a division element 65 for measuring the current flowing through the current conductor L. In the current-carrying state, the difference obtained between the signals $I_+$, $I_-$ given a constant light intensity is proportional to the current. The sum of the two signals is proportional to the light intensity. By dividing the difference by the sum in the division element 65, the following is obtained as detection signal 60

$$S=(I_+-I_-)/(I_++I_-)=K\sin(\Delta\Phi)=K\Delta\Phi$$

which is now independent of the light intensity $I_0$, but is proportional to the current I.

Figure 4:
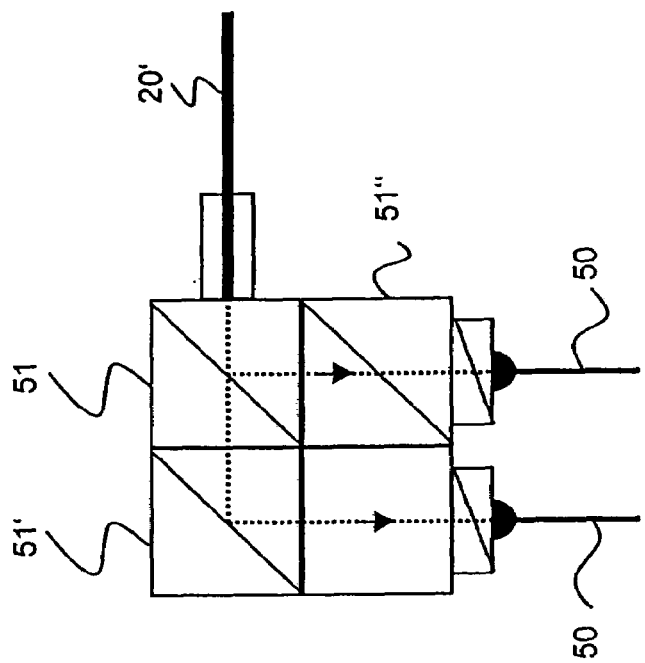
FIG. 4 shows a detector of the current sensor according to the invention in accordance with a second embodiment of the invention.

FIG. 4 illustrates a further embodiment of the modulation unit of the current sensor according to the invention. Three at least approximately identical beam splitters 51, 51', 51" are present in this case. Each of the two backward-traveling waves has thus experienced a reflection and a transmission in the beam splitters. This arrangement has the advantage that both waves experience the same variations in the properties of the beam splitters, which are caused by aging processes, temperature fluctuations and other external influences.

By virtue of the current sensor according to the invention, it is possible to obtain a detection signal which is independent of the stability of the modulator and its modulation unit. Further variants of the examples presented above are possible in this case. Thus, instead of a coil-type sensor fiber, it is also possible to use an integrated optical element as a coil-type optical sensor. The coil can comprise a single turn both in the fiber-optic and in the integrated optical embodiment. Furthermore, a polarizing beam splitter can also be used instead of a polarization-insensitive beam splitter and the two analyzers.

LIST OF REFERENCE SYMBOLS

L Current conductor,
1 Sensor fiber,
10 Reflector,
2 Fiber-optic lead,
20 First fiber branch,
20' Second fiber branch,
21 Polarizer,
22 Delay loop,
23 Further polarization-maintaining fiber segment,
3 Phase delay element,
4 Light source,
5 Detector,
50' Detector signal line,
51" Beam splitter,
52 Analyzer,
53 Photodiode,
6 Signal processor,
60 Sensor signal line,
61 Modulation signal line,
62 Subtraction element,
63 Addition element,
64 Quadrature control,
65 Division element,
7 Phase modulator,
7' Phase modulator,
8 Coupler.

It will be appreciated by those skilled in the art that the present invention can be embodied in other specific forms without departing from the spirit or essential characteristics thereof, and that the invention is not limited to the specific embodiments described herein. The presently disclosed embodiments are therefore considered in all respects to be illustrative and not restrictive. The scope of the invention is indicated by the appended claims rather than the foregoing description, and all changes that come within the meaning and range and equivalents thereof are intended to be embraced therein.

The invention claimed is:

1. An optical current sensor comprising:
  a detector;
  a reflection interferometer, which has a fiber-optic lead and coil-type optical sensor, the fiber-optic lead having a first fiber branch and a second fiber branch, which two fiber branches are connected to one another via a coupler on the sensor side, the first fiber branch being connected to a light source and the second fiber branch being connected to the detector, and the sensor being connected to the lead at a first end and being provided with a reflector at the second end; and
  a first means for phase modulation of a differential phase of two mutually orthogonally polarized optical waves which propagate in the lead;
  wherein
  the first fiber branch is designed as a polarization-maintaining first fiber branch for two forward-travelling, mutually orthogonally polarized waves;
  the second branch is designed as a polarization-maintaining second fiber branch for two backward-travelling mutually orthogonally polarized waves;
  the first means for phase modulation is functionally connected to one of the first and second fiber branches; and
  the optical lengths of the fiber branches are, within the coherence length of the light source, identical.

2. The current sensor as claimed in claim 1, wherein the two fiber branches are connected to one another via the coupler in such a way that the direction of the linear polarization of one of the linearly polarized optical waves propagating in the two fiber branches is oriented parallel to one fiber principal axis in the first fiber branch and parallel to the other fiber principal axis in the second fiber branch.

3. The current sensor as claimed in claim 1, wherein the two fiber branches have at least approximately the same optical length.

4. The current sensor as claimed in claim 1, wherein the first means for phase modulation, and the detector are connected to a signal processor having a means for quadrature control and for compensating a quasi-static phase shift.

5. The current sensor as claimed in claim 1, wherein the first means for phase modulation and the detector are connected to a signal processor having a means for compensating a phase modulation induced by an AC current to be measured.

6. The current sensor as claimed in claim 1, wherein the detector has three beam splitters arranged in such a way that each of the backward-traveling waves experiences a reflection and a transmission by the beam splitters.

7. The current sensor as claimed in claim 1, comprising a second means for phase modulation, wherein the second means for phase modulation is functionally connected to the other of the first and second fiber branches.

8. The current sensor as claimed in claim 7, wherein both means for phase modulation are connected to the same signal processor.

9. The optical current sensor of claim 1, wherein the first fiber branch and the second fiber branch are not connected to one another on the side opposite the sensor side.

10. A method for setting an operating point in an optical current sensor having a reflection interferometer as claimed in claim 1, wherein the current sensor has two fiber branches, comprising:
  propagating forward-traveling mutually orthogonally linearly polarized waves in one of the two fiber branches;
  propagating backward-traveling, mutually orthogonally linearly polarized waves in the other fiber branch; and,
  in at least one of the two fiber branches, regulating a mutual shift in the phases of the mutually orthogonally linearly polarized waves propagating in one of the two fiber branches;
  wherein the optical lengths of the fiber branches are within the coherence length of the light source, identical.

11. The method as claimed in claim 10, comprising setting the operating point quasi-statically to the quadrature point.

12. The method as claimed In claim 11, comprising:
  splitting the backward-traveling mutually orthogonally linearly polarized wave pair into two pairs and bringing each resulting wave pair to interference in an analyzer, the transmission directions of the analyzers being at 90° with respect to one another; and
  detecting interference signals;
  forming a difference between the interference signals; and regulating the difference to zero.

13. The method as claimed in claim 10, comprising:
setting the operating point to the quadrature point; and
compensating periodic phase shifts caused by the current to be measured.

14. The method as claimed in claim 13, comprising:
splitting the backward-traveling mutually orthogonally linearly polarized wave pair into two pairs; and
bringing each resulting wave pair to interference in an analyzer, wherein the transmission directions of the analyzers are at 90° with respect to one another;
detecting Interference signals;
forming a difference between the interference signals; and
regulating the difference to zero.

15. A method for current measurement by means of an optical current sensor having a reflection configuration as claimed in claim 1, which current sensor has two fiber branches, comprising:
propagating forward-traveling orthogonally linearly polarized waves in one of the two fiber branches;
propagating backward-traveling, orthogonally linearly polarized waves in the other fiber branch;
regulating, in at least one fiber branch, a difference in the phases of the waves propagating therein;
splitting the backward-travelling mutually orthogonally linearly polarized wave pair into two wave pairs and bringing each of the resulting two wave pairs to interference in a respective analyzer, the forward directions of the analyzers being at 90° with respect to one another,
detecting two Interference signals;
forming a sum of and a difference between the interference signals; and
dividing the difference by the sum to obtain a signal which is at least approximately proportional to the current to be measured.

* * * * *